United States Patent [19]

Brault et al.

[11] Patent Number: 4,777,119
[45] Date of Patent: Oct. 11, 1988

[54] METHOD FOR DEVELOPING POLY(METHACRYLIC ANHYDRIDE) RESISTS

[75] Inventors: Robert G. Brault, Santa Monica; Leroy J. Miller, Canoga Park, both of Calif.

[73] Assignee: Hughes Aircraft Company, Los Angeles, Calif.

[21] Appl. No.: 1,058

[22] Filed: Jan. 7, 1987

Related U.S. Application Data

[63] Continuation-in-part of Ser. No. 823,886, Jan. 29, 1986, abandoned.

[51] Int. Cl.$^4$ ................................................. G03C 5/00
[52] U.S. Cl. .................................... 430/296; 430/326; 430/327; 430/330; 430/331
[58] Field of Search ............... 430/296, 326, 327, 330, 430/331, 967; 378/34

[56] References Cited

U.S. PATENT DOCUMENTS

| 4,087,569 | 5/1978 | Hatazakis | 427/43 |
| 4,264,715 | 4/1981 | Miura et al. | 430/326 |
| 4,341,850 | 7/1982 | Coane | 430/11 |
| 4,508,812 | 4/1985 | Brault | 430/270 |

FOREIGN PATENT DOCUMENTS 2946405  5/1980  Fed. Rep. of Germany.
57-114141  7/1982  Japan.

OTHER PUBLICATIONS

Grieco et al., "Photerjist Developer compounds", IBM Tech. Disc. Bull. vol. 13, (7), Dec. 1970, p. 2009.

*Primary Examiner*—Jose G. Dees
*Attorney, Agent, or Firm*—Wanda K. Denson-Low; A. W. Karambelas

[57] ABSTRACT

The present invention relates to a process for forming an image with a positive resist, said process involves the steps of forming on a substrate a positive resist layer of poly(methacrylic anhydride). The resist layer baked at a temperature of 200° C. to 350° C. and thereafter irradiated with a pedetermined pattern of ionizing radiation. The irradiated area is then developed utilizing a developer solvent that is composed of solution of a base selected from the group consisting of alkali metal hydroxides, ammonium hydroxides (including quarternary ammonium hydroxides), alkali metal alkoxides and alkali metal carbonates; and a hydroxylic solvent selected from the group consisting of branched or straight chain alcohols having a $C_1$–$C_{12}$ carbon content and water or mixtures thereof; and rinsing the resist with the same solvent selected above.

10 Claims, 1 Drawing Sheet

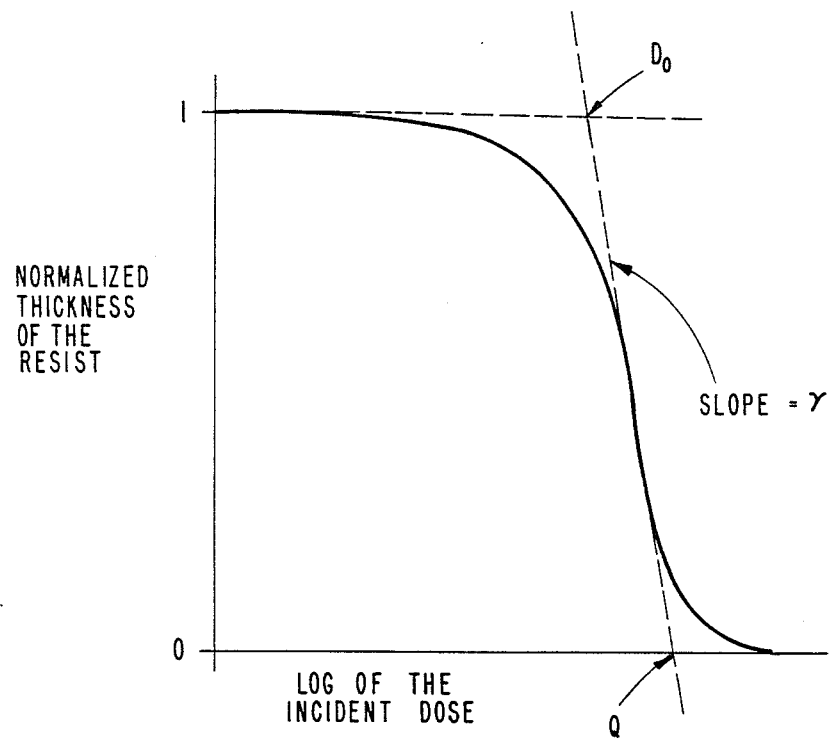

METHOD FOR DEVELOPING POLY(METHACRYLIC ANHYDRIDE) RESISTS

This application is a continuation-in-part of application Ser. No. 06/823,886, filed Jan. 29, 1986 abandoned.

TECHNICAL FIELD

The present invention relates to the development of positive resists utilized in the fabrication of microcircuits. More particularly, the present invention relates to a method of developing a positive resist of poly(methacrylic anhydride), hereinafter referred to as PMAH.

BACKGROUND OF THE INVENTION

It was recognized several years ago that electron beams could be used to delineate structures smaller than those that can be made with UV radiation. The higher resolutions now achievable coupled with the electronics industry's quest to reduce circuit size and increase the switching speed of these circuits, has resulted in better line width control, and circuit chips with minimum feature widths of 1 μm or smaller. The role of the resist in device lithography has become increasingly important since an electron resist must be capable of being patterned by altering its solubility with a defined beam of electrons and subsequently dissolving (developing) the unwanted regions of the resist. Additionally, the resist must protect the underlying substrate during the various etching operations encountered in semiconductor processing. Basically, there are two types of electron resists, which are distinguished by their response upon being exposed to radiation and their resulting solubility behavior in the developing solvent. Materials which are rendered more soluble upon exposure to radiation are termed positive resists. Positive resist action results from radiation-induced degradation of the chain. Contrastingly, negative resists are rendered less soluble upon exposure to radiation and generally negative resist action results from radiation induced crosslinking.

One material which has been utilized advantageously as a positive resist in electron beam lithographic processes is poly(methacrylic anhydride), hereinafter referred to as PMAH. U.S. Pat. No. 4,004,043 (issued Jan. 18, 1977) discloses positive resists made of nitrated polymers and copolymers of methacrylic acid, methacrylic anhydride, etc. Generally, the surface of a semiconductor was coated with a PMAH film prior to exposure to a radiation source such as an electron beam. Many problems arise, however, with the use of a PMAH resist. The solvents typically utilized for PMAH coating, for example, dimethylacetamide, dimethylformamide and N-methylpyrrolidone, do not adequately wet the semiconductor wafer surface to provide a uniform coating, particularly, in the case of silicon.

The PMAH film is usually prepared by first applying a solution coating of poly(t-butyl methacrylate), hereinafter referred to as PtBMA, to the surface of the wafer. The PtBMA is then heated to above 200° C. for two to three hours to convert the coating to a film of PMAH. Additional problems, however, also exist with this method. First, there can be a significant variation in the composition and consistency of the resist produced, thereby making quality control difficult. One explanation is that if there is an incomplete conversion of PtBMA to PMAH, as oftentimes occurs, depending on the unformity of process conditions, certain areas of the film coating will contain both PMAH and PtBMA. During subsequent steps in the lithographic process, the irradiated resist area is dissolved, and thus removed from the wafer surface, upon exposure to the conventional developer solvents. Since the PtBMA on the non-irradiated areas is more soluble in these developer solvents than the PMAH in these same areas, the resist film structure remaining on the wafer surface may be uneven and inconsistent. Another explanation is that crosslinks are formed after the PtBMA is all converted to PMAH.

U.S. Pat. No. 4,508,812 (which issued on Apr. 2, 1985, and which is assigned to the present assignee) discloses a method of fabrication of a PMAH resist. A wafer is first precoated with a thin precursor layer of PtBMA which is then heated to a temperature at which the PtBMA is converted to PMAH, to form a thin, relatively uniform layer of PMAH. A solution of PMAH is then applied over this precursor layer so that a uniformly distributed coating of the desired thickness of PMAH is obtained upon the pre-coated surface of the semiconductor wafer.

There are a number of physical and chemical properties required of resist materials. Solubility is an important consideration in the development of the resist, since films are normally deposited on a substrate from solution by spin coating. Solubility in organic solvents is therefore a necessary requirement. The resist must exhibit etch resistance and it should have adequate adhesion to the desired substrate in order to realize maximum resolution.

Sensitivity, "Q", is a parameter of prime importance. It is conventionally defined as the input incident energy or dose required to achieve the necessary chemical response in the resist. The necessary chemical response is that which on development of the resist results in a faithful replication (in the resist) of the original pattern specified by the circuit designer. Contrast, "γ", another parameter of prime importance, is generally defined as the absolute value of the change in the normalized thickness of the residual resist divided by the change in the log of the incident dose. "Q" and "γ" are defined graphically for a positive resist in FIG. 1. "γ" is an important parameter because it effects the pattern resolution attainable with a given resist for a given set of processing conditions. "γ" can also be more easily defined by reference to the sensitivity curve for a positive resist (FIG. 1), where it is simply the absolute value of the slope of the approximately linear descending portion of the curve.

In the case of a positive resist, the film thickness of the irradiated region remaining after development decreases, until eventually a dose, "$D_c$", is reached. This results in complete removal of the film on development. Ths value also represents the sensitivity of a positive resist. The contrast of the positive resist, "$\gamma_p$", in an idealized situation, is related to the rate of degradation of molecular weight and is defined as:

$$\gamma_p = 1/(\log D_c - \log D_o) = \left[\log \frac{D_c}{D_o}\right]^{-1},$$

wherein "$D_o$" is the dose at which the developer begins to attack the irradiated film. "$D_o$" is usually determined in actual practice, however, by extrapolating the linear portion of the plot of the film normalized thickness remaining vs. the log of the dose to a value of 1.0 normalized initial film thickness (refer to FIG. 1).

Many methods have been utilized to attempt to improve the resolution and sensitivity of positive resists. U.S. Pat. No. 3,964,908 (which issued on June 22, 1976) discloses polymers of methyl methacrylate, methacrylic acid, and its anhydride which contain dimethylglutarimide units. Development of images with this type of resist was disclosed utilizing 2-ethoxyethanol(ethyl cellosolve) or in an aqueous ethanol.

U.S. Pat. No. 4,264,715 (which issued on Apr. 28, 1981), however, discloses a method of forming an image on a positive resist layer of poly(methacrylic anhydride) utilizing a developer solvent mixture consisting of a polar organic solvent (capable of dissolving PMAH) and a non-solvent (incapable of dissolving PMAH). Suitable non-solvents for this process included: benzene, toluene and chlorobenzene, methyl isobutyl ketone and methyl ethyl ketone, ethyl acetate, isoamyl acetate, etc. Suitable polar solvents included: dimethylacetamide, N-methylpyrrolidone and dimethyl sulfoxide.

Given the importance of microcircuit fabrication, a better, method of developing resist images which more easily and reproducibly renders optimum resolution, sensitivity, contrast, etc. is clearly needed. PMAH is clearly an important resist material because of its resolution and sensitivity capabilities. However, finding a developer solution which maximizes these optimum characteristics has previously posed a significant obstacle.

SUMMARY OF THE INVENTION

The present invention relates to a process for forming an image with a positive resist, said process involves the steps of forming on a substrate a positive resist layer of poly(methacrylic anhydride) and baking the resist layer at a temperature of 200° to 350° C. The resist layer is thereafter irradiated with a predetermined pattern of ionizing radiation. The irradiated area is then developed utilizing a developer solvent that is composed of solution of a base selected from the group consisting of alkali metal hydroxides, ammonium hydroxides (including quarternary ammonium hydroxides), alkali metal alkoxides and alkali metal carbonates, and a hydroxylic solvent selected from the group consisting of branched or straight chain alcohols having a $C_1$–$C_{12}$ carbon content and water or mixtures thereof; and rinsing the resist with the same solvent selected above, or with water.

It is a feature of the present invention to provide a method of developing a positive resist image which has good sensitivity, contrast and resolution characteristics.

These and other features and advantages of the present invention will become apparent after a thorough review of the description of the invention, the examples and the accompanying claims.

DETAILED DESCRIPTION OF THE INVENTION

The present invention relates to a process for forming an image with a positive resist, said process comprising the steps of:

(a) forming on a substrate a positive resist layer of poly(methacrylic anhydride);

(b) baking the resist layer to a temperature of 200° to 350° C.;

(c) irradiating said resist layer with a predetermined pattern of ionizing radiation;

(d) developing the irradiated area with a developer comprising a solution of a base selected from the group consisting of alkali metal hydroxides, ammonium hydroxides (including quarternary ammonium hydroxides), alkali metal alkoxides and alkali metal carbonates; and a hydroxylic solvent selected from the group consisting of branched or straight chain alcohols having a $C_1$–$C_{12}$ carbon content and water; and (e) rinsing the resist with the same solvent selected above, or with water.

Examples of bases suitable for use in conjunction with the present invention include, but are not limited to the following: potassium hydroxide (KOH), sodium hydroxide (NaOH); lithium hydroxide, potassium butoxide (Kt-BuO), tetramethylammonium hydroxide, ammonium hydroxide, tetrabutylammonium hydroxide, tetraethylammonium hydroxide, tetrapropylammonium hydroxide, benzyltrimethylammonium hydroxide, benzyltriethylammonium hydroxide, benzyltripropylammonium hydroxide, benzyltributylammonium hydroxide, sodium methoxide, sodium ethoxide, sodium propoxide, sodium n-butoxide, sodium 2-ethoxyethoxide, sodium 2-methoxyethoxide, sodium 2-butoxyethoxide, potassium 2-ethoxyethoxide, potassium 2-methoxyethoxide, potassium 2-butoxyethoxide, potassium propoxide, potassium n-butoxide, potassium 2-methylpropoxide, lithium methoxide, lithium ethoxide, lithium propoxide, lithium butoxide, lithium 2-ethoxyethoxide, lithium 2-methoxyethoxide, sodium carbonate, potassium carbonate, lithium carbonate, etc.

Examples of solvents suitable for use in conjunction with the present invention include, but are not limited to the following: water, ethanol, 1-propanol (n-propyl alcohol), 2-propanol (isopropyl alcohol), 1-butanol (n-butyl alcohol), 2-butanol (sec-butyl alcohol), 1-pentanol (pentyl alcohol), isoamyl alcohol, 1-hexanol (hexyl alcohol), 1-heptanol (heptyl alcohol), 1-nonanol (nonyl alcohol), 1-undecanol (undecyl alcohol), 1-dodecanol (dodecyl alcohol), 2-phenylethanol, 3-phenyl-1-propanol, 2-ethyl-1-hexanol, 2-(2-ethoxyethoxy)ethanol, 2-(2-methoxyethoxy)ethanol, 2-(2-butoxyethoxy)ethanol, ethanolamine, ethylaminoethanol, methylaminoethanol, diethylaminoethanol, dimethylaminoethanol, diethanolamine, triethanolamine, ethylene glycol, propylene glycol, butanediol, tetrahydrofurfuryl alcohol, cyclohexanol, cyclohexanemethanol, methylcyclohexanol, 2-ethoxyethanol, 2-methoxyethanol, 2-butoxyethanol, 2-phenoxyethanol, methanol, butanol, 2-methyl-2-propanol, n-octanol, n-decanol, isobutyl alcohol, propyleneglycolmonomethyl ether, etc or mixtures thereof.

In accordance with the present invention, a semiconductor resist wafer is first coated with poly(tertbutyl methacrylate) or PtBMA. PtBMA can be dissolved in a variety of solvents for spincoating. For the purposes of illustration, a 7% solution in 2-ethoxyethyl acetate is used. However, solutions with other solvents and other concentrations can also be used. The PtBMA is thereafter converted to poly(methacrylic anhydride) or PMAH, by heating the coated wafer at approximately 200° C. to 240° C. for 1 to 24 hours in a vacuum oven. The conversion of PtBMA to PMAH takes place according to the following reaction scheme:

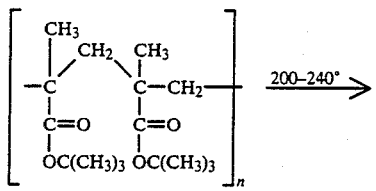

PtBMA

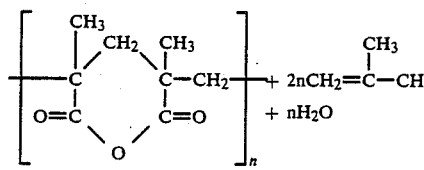

PMAH

It should be noted that several methods currently exist within the art that can be utilized to form a positive resist layer of poly(methacrylic anhydride). However, the method described above is the preferred method. Problems have been known to exist with this particular method for forming a positive resist layer of PMAH i.e., crosslinking, etc. However, the developer solutions and developer process of the instant invention can be utilized in spite of any such difficulties.

The coated resist is thereafter baked at a temperature of 200° C. to 350° C. The actual baking time will depend on the temperature chosen as is well understood by those familiar with the art and science of organic chemistry. Reactions that proceed very rapidly at high temperatures will proceed much more slowly at substantially lower temperatures. Thus, while the bake time can be 0.5 hr at 260° C., it should be about comparably longer at 200° C. At temperatures such as these, even longer bake times can be tolerated. During the bake treatment the PMAH coating becomes less soluble and more resistant to attack by solvents. Although we are not certain what occurs during the bake treatment, we believe several types of changes are possible. First, if there is any solvent in the film, this can be removed. Second, the PMAH coating may be annealed and densified, with a concomitant reduction in voids. Third, some intermolecular anhydride crosslinks may be formed. We believe that thermal crosslinking makes the unexposed areas of the resist less soluble. Therefore, in the exposed areas of the resist, the contrast and therefore the resolution is greater. However, whatever is occuring during the bake treatment, the increase in resistance to solvent attack is beneficial to the process of developing the images after they are written with a pattern of radiation.

The resist wafer is then irradiated with a predetermined pattern of ionizing radiation and developed as will be hereinafter discussed. The ionizing radiation can be either in the form of a electrons, ions or X-rays. The electrons or ions can be focused beams, scanning beams or collimated beams.

Development of the resist occurs by first dipping resist or wafer in a developer solution which comprises a mixture of a base and a solvent, as enumerated previously. The method of dipping is used here solely for the purposes of illustration. Other methods for development suitable for use in accordance with the instant invention include but are not limited to the following: spray development, puddle development or any other conventional methods utilized for developing positive photoresists. The resist wafer is developed for approximately 10 sec. to 30 minutes and thereafter rinsed immediately with deionized water.

It should be noted, and it is well known to those experienced in the art of photolithography and electron beam lithography, that problems are occasionally encountered when the adhesive bond between the resist and the substrate is atacked by the developer. In such cases, it is common practice to first coat the substrate with an adhesion promoter. The use of such adhesion promoters is also acceptable and is often very useful in the practice of this invention. Examples of such adhesion promoters include, but are not limited to, hexamethyldisilazane, γ-methacryloyloxypropyltrimethoxysilane, γ-aminopropyltrimethoxysilane, N-β-(aminoethyl)-γ-aminopropyltrimethoxysilane, vinyltriethoxysilane, vinyltriacetoxysilane, γ-glycidoxypropyltrimethoxysilane, β-(3,4-epoxycyclohexyl)ethyltrimethoxysilane, vinyltrimethoxysilane, vinyl-tris-(β-methoxyethoxy)silane, γ-mercaptopropyltrimethoxysilane, N'-(β-aminoethyl)-N-(β-aminoethyl)-γ-aminopropyltrimethoxysilane, γ-ureidopropyltriethoxysilane, γ-mercaptopropyltriethoxysilane, γ-methacryloyloxypropyl-tris-(β-methoxyethoxy)silane, γ-aminopropyltrimethoxysilane, vinyltrichlorosilane, methyltrichlorosilane, methyltrimethoxysilane, methyltriethoxysilane, ethyltrichlorosilane, γ-chloropropyltrimethoxysilane, phenyltrichlorosilane, 4-chlorophenyltrichlorosilane, triethoxysilylorganosulfonyl azides, and the like.

Generally, the most commonly used resist, and the one to which all others are compared is poly(methyl methacrylate) (PMMA). The sensitivity of a PMMA resist is quoted in the range of approximately 50 to 500 $\mu C/cm^2$. [See W. Moreau, D. Merritt, et al, J. Vac. Sci. Technol., Vol. 16, No. 6 1989–1991, (1979)]. Moreover, the sensitivity of PMMA can range from 46–180 $\mu C/cm^2$ depending upon the developing solution and developing process chosen. PMAH, however, has superior resistance to dry etching. Therefore, the examples depicted on the succeeding pages should be evaluated based on the generally acceptable sensitivity levels currently available in the art.

Sensitivity (Q) and contrast (γ) were previously defined and discussed as being two criteria utilized to evaluate the performance of a developer solution. Another criterion which aids in evaluating the performance of developer solutions is the percentage of thinning or the percentage of swelling observed after development of the resist. It is believed that swelling reduces the resolution attainable while thinning reduces the amount of resist material that remains on the wafer in the unexposed areas. This means that there will be a thinner protective coating over those areas during the subsequent processing steps. The amount of thinning or swelling that is acceptable depends on how the resist changes when it thins or swells. The criteria for what is acceptable should be based on the profiles of the lines and how well the remaining resist protects the wafer during processing. It is generally undesirable to have more than 30 to 50% thinning. Conversely, it is generally desirable to have no more than 5 to 10% swelling.

A better and more thorough understanding of the invention can be gained from the examples on the succeeding pages. It should be noted that all of the results indicated in the following examples include ±5% experimental error.

EXAMPLES

Example I

In this example, four silicon wafers were spincoated with poly(tert-butyl methacrylate) or PtBMA using a 7% solution in 2-ethoxyethyl acetate. The PtBMA had a weight-average molecular weight ($\overline{M}_w$) of 1,320,000 as measured by light scattering. The PtBMA was converted to poly(methacrylic anhydride) or PMAH by heating the coated wafers at 230° C. for four hours in a vacuum oven. The PMAH coatings were very smooth and were about 500 nm thick. Patterns of lines and 25×25 μm squares were written on the wafers with an electron beam. The dosage was varied systematically in these so that the behavior of the PMAH resist resist at various doses could be readily determined. A pattern was developed by dipping the wafers in solutions containing various concentrations of potassium hydroxide in 2-ethoxyethanol at 25° C. for specifed periods of time. The wafers were thereafter thoroughly rinsed in water and dried in a vacuum at room temperature. The thickness of the resist remaining in the squares was measured with a Nanospec microarea film thickness gauge. The sensitivity (Q) and contrast ($\gamma$) were determined from plots of the normalized thickness against the log of the electron dose. Measurements were also made of the thickness of the unexposed resist to determine the percentage of thinning (−) or swelling (+) caused by the developer. Results from these measurements are presented in Table IA-IB on the next page. The pieces of wafer were also cleaved, and the widths and profiles of the lines in the patterns were determined by examination with a scanning electron microscope (SEM). Images that were developed with 0.21 and 0.41N KOH in 2-ethoxyethanol were poor to marginal in line quality, but images developed in 0.64 and 0.85N KOH had excellent lines that were down to 0.2 μm in width and that had walls perpendicular to the surface of the wafer.

"$\gamma$" affects pattern resolution as discussed on pages 4–5 of the specification. Resolution, which is the ability to define narrow lines close together, is more adequately described as the narrowest isolated lines that can be drawn properly, and the narrowest gaps that can be left between two broad lines or fields. The results in Table IB illustrate contrast ($\gamma$).

TABLE IA

| | KOH IN 2-ETHOXYETHANOL | | | | | |
|---|---|---|---|---|---|---|
| | 0.21 N | | | 0.41 N | | |
| DEVEL. TIME, MIN. | Q, $\mu C/cm^2$ | $\gamma$ | % Thinning (−) or Swelling (+) | Q, $\mu C/cm^2$ | $\gamma$ | % Thinning (−) or Swelling (+) |
| 1 | 40.3 | 1.75 | −1.32 | 20.5 | 1.87 | +2.78 |
| 3 | ~15 | ~2.5 | −2.80 | 11.6 | 5.02 | −5.07 |
| 10 | 4.6 | 2.04 | +8.21 | 4.1 | 1.65 | +2.69 |

TABLE IB

| | KOH IN 2-ETHOXYETHANOL | | | | | |
|---|---|---|---|---|---|---|
| | 0.64 N | | | 0.85 N | | |
| DEVEL. TIME, MIN. | Q, $\mu C/cm^2$ | $\gamma$ | % Thinning (−) or Swelling (+) | Q, $\mu C/cm^2$ | $\gamma$ | % Thinning (−) or Swelling (+) |
| 1 | 25.6 | 3.73 | −0.51 | 23.5 | 5.37 | −1.65 |
| 3 | 13.0 | 3.40 | −1.80 | 16.2 | 15.0 | −5.14 |
| 10 | 6.0 | 5.17 | −2.11 | 15.4 | 28.4 | −1.59 |
| 30 | 6.6 | 46.5 | −4.97 | ~15.2 | 24.3 | −3.87 |

EXAMPLE 2

This example demonstrates that the molecular weight of the PtBMA precursor of the PMAH is not a critical factor. Silicon wafers were coated with PtBMA samples with $\overline{M}_w$ values of 280,000 (Table III); 504,000 (Table II) and 1,320,000 (Table IV) and converted to PMAH by heating as described in Example 1. Patterns were written with a focused electron-beam system and developed with 0.64 and 0.85N KOH in 2-ethoxyethanol. The data taken from these patterns were pursuant to the methods described in Example 1, but since a different electron-beam system and pattern were used, only the upper limit of the sensitivity could be determined in some cases. The results are given in Tables II, III and IV. In each case, the images contained excellent lines that were 0.3 μm or less in width and that had walls perpendicular to the surface. These images also contained well defined gaps between 5 μm wide lines. These gaps were in accord with the designed gapwidth at gapwidths down to 0.4 μm wide, and there was little or no perceptible thinning of the resist in these gaps.

TABLE II

| | KOH IN 2-ETHOXYETHANOL | | | | | |
|---|---|---|---|---|---|---|
| | 0.64 N | | | 0.85 N | | |
| DEVEL. TIME, MIN. | Q, $\mu C/cm^2$ | $\gamma$ | % Thinning (−) or Swelling (+) | Q, $\mu C/cm^2$ | $\gamma$ | % Thinning (−) or Swelling (+) |
| 1 | 18.2 | 2.81 | −3.66 | 21.3 | 8.17 | −2.19 |
| 3 | 8.8 | 3.60 | −1.65 | 14.3 | 11.5 | −1.65 |
| 10 | <10 | — | −2.63 | 15.8 | 10.9 | −2.43 |
| 30 | ~5.3 | — | −1.17 | 14.5 | 8.62 | −2.31 |

TABLE III

| | KOH IN 2-ETHOXYETHANOL | | | | | |
|---|---|---|---|---|---|---|
| | 0.64 N | | | 0.85 N | | |
| DEVEL. TIME, MIN. | Q, $\mu C/cm^2$ | $\gamma$ | % Thinning (−) or Swelling (+) | Q, $\mu C/cm^2$ | $\gamma$ | % Thinning (−) or Swelling (+) |
| 1 | 22.8 | 3.04 | −0.16 | 23.0 | 5.22 | +5.88 |
| 3 | 12.7 | 3.49 | +1.77 | 17.6 | 4.90 | +6.06 |

TABLE III-continued

| | KOH IN 2-ETHOXYETHANOL | | | | | |
|---|---|---|---|---|---|---|
| | 0.64 N | | | 0.85 N | | |
| DEVEL. TIME, MIN. | Q, $\mu C/cm^2$ | $\gamma$ | % Thinning (−) or Swelling (+) | Q, $\mu C/cm^2$ | $\gamma$ | % Thinning (−) or Swelling (+) |
| 10 | <10 | — | +4.70 | 15–20 | — | +4.79 |
| 30 | <5 | — | +0.10 | ~13 | ~57 | +4.36 |

TABLE IV

| | KOH IN 2-ETHOXYETHANOL | | | | | |
|---|---|---|---|---|---|---|
| | 0.64 N | | | 0.85 N | | |
| DEVEL. TIME, MIN. | Q, $\mu C/cm^2$ | $\gamma$ | % Thinning (−) or Swelling (+) | Q, $\mu C/cm^2$ | $\gamma$ | % Thinning (−) or Swelling (+) |
| 3 | 5.78 | 2.49 | +2.50 | 11.1 | 8.94 | +3.58 |
| 10 | <2.5 | — | +5.58 | 12.5 | 10.3 | +7.45 |
| 30 | <2.5 | — | +9.59 | ~13.2 | ~7.9 | +7.35 |

EXAMPLE 3

In this example, silicon wafers were coated with PMAH and exposed with an electron beam as described in Example 2. In certain cases, however, the wafer surface was first cleaned with a specific cleaning procedure or was treated with an adhesion promoter. The surface treatments are described below:

Wafer A: There was no specific surface treatment. The PtBMA used as the precursor of the PMAH had an $\bar{M}_w$ of 280,000.

Wafer B: There was no specific surface treatment. The PtBMA precursor had an $\bar{M}_w$ of 504,000.

Wafer C: The wafer was first spin-coated with a 0.04% solution of γ-methacryloyloxypropyltrimethoxysilane in toluene and heated for 5 minutes at 180° C. The wafer with the adhesion promoter thereon is heated at this 180° C. temperature. A 360 nm coating of PMAH was then prepared on this wafer using PtBMA with $\bar{M}_w$ of 1,320,000.

Wafer D: The wafer was first spin-coated with hexamethyldisilazane and heated at 180° C. for 15 minutes. The wafer with the adhesion promoter thereon is heated at this 180° C. temperature. A 760 nm coating of PHAH was then prepared from the same PtBMA used for Wafer C.

Wafer E: The wafer was first cleaned with a buffered oxide etch, which removed any oxidized coating on the surface. A 380 nm coating of PMAH was then prepared from the same PtBMA used for Wafer C.

Wafer F: The wafer was first cleaned with a cleaning procedure which involves treatments with an ammoniacal solution of hydrogen peroxide and a solution of hydrochloric acid and hydrogen peroxide. A 370 nm coating was then prepared on this surface from the same PtBMA used for Wafer C.

Wafer G: The wafer was prepared similarly to that utilized to prepare Wafer C, however, the PtBMA had $\bar{M}_w$=280,000 and the PMAH coating was 500 nm thick.

Wafer H: The wafer was first coated with triethoxysilylorganosulfonyl azide (an adhesion promoter) and then coated with PtBMA with a $\bar{M}_w$=280,000. The wafer was then baked at 230° C. in a vacuum for 4 hours. The resulting PMAH coating was 500 nm thick.

The electron-beam images in these resist coatings were developed with solutions of bases in hydroxylic solvents as indicated in Tables V-A V-E. A visible image was obtained in each case, but the sensitivity could be determined from the pattern only if it fell between 1 and 32 $\mu C/cm^2$. This example shows that a wide range of bases and hydroxylic solvents can be used.

TABLE V-A

| Type of Treated Wafer | DEVELOPER | | Concentration Moles/Liter | Time (Min.) | Sensitivity $\mu C/cm^2$ |
|---|---|---|---|---|---|
| | Solvent | Base | | | |
| A | n-Butanol | KOH | 1 | 10 | >32(~70) |
| A | 2-Propanol(isopropyl alcohol) | KOH | 1 | 10 | >32(~70) |
| A | 2-Ethoxyethanol | NaOH | 1 | 10 | <1 |
| A | Propylene glycol monomethyl ether (Arcosolve) | TMAH* | 1 | 3 | 2.6 |
| B | 2-Ethoxyethanol | TMAH* | 1 | 3 | 1.7 |
| B | Propylene glycol monomethyl ether (Arcosolve) | TMAH* | 1 | 10 | <1 |

*TMAH = tetramethylammonium hydroxide pentahydrate

TABLE V-B

| Type of Treated Wafer | DEVELOPER Solvent | Base | Concentration Moles/Liter | Time (Min.) | Sensitivity $\mu C/cm^2$ |
|---|---|---|---|---|---|
| C | Methanol | KOH | 1 | 1 | <1 |
| C | Methanol | KOH | 1 | 3 | <1 |
| C | Methanol | KOH | 1 | 10 | <1 |
| C | n-Undecanol | KOH | Saturated | 3 | 13.9 |
| C | n-Undecanol | KOH | Saturated | 10 | 2.1 |
| C | 2-Methoxyethanol | KOH | 1 | 1 | <1 |
| C | 2-Ethoxyethanol | TMAH* | 1 | 1 | <1 |
| C | Water | KOH | 1 | 3 | <1 |
| C | Water | TBAH** | ~0.4(10%) | 3 | 6.1 |

*TMAH = tetramethylammonium hydroxide pentahydrate
**TBAH = tetrabutylammonium hydroxide

TABLE V-C

| Type of Treated Wafer | DEVELOPER Solvent | Base | Concentration Moles/Liter | Time (Min.) | Sensitivity $\mu C/cm^2$ |
|---|---|---|---|---|---|
| D | n-Undecanol | KOH | Saturated | 10 | 19.3 |
| D | 2-Methyl-2-propanol (tert-butyl alcohol) | $KOC(CH_3)_3$ | 1 | 3 | 16.8 |
| D | 2-Methyl-2-propanol (tert-butyl alcohol) | $KOC(CH_3)_3$ | 1 | 10 | 13.8 |
| D | 2-Ethoxyethanol | TMAH* | 1 | 1 | 4 |
| D | 2-Ethoxyethanol | TMAH* | 1 | 3 | <1 |
| D | 2-Phenoxyethanol | KOH | 1 | 3 | 16 |
| D | Propyleneglycolmonomethylether (Arcosolve) | TMAH* | 1 | 3 | 2.8 |
| D | Water | KOH | 1 | 3 | 17.6 |
| D | Water | TBAH** | ~0.4(10%) | 10 | 10.6 |

*TMAH = tetramethylammonium hydroxide pentahydrate
**TBAH = tetrabutylammonium hydroxide

TABLE V-D

| Type of Treated Wafer | DEVELOPER Solvent | Base | Concentration Moles/Liter | Time (Min.) | Sensitivity $\mu C/cm^2$ |
|---|---|---|---|---|---|
| E | 2-Ethoxyethanol | TMAH* | 1 | 1 | <1 |
| E | 2-Phenoxyethanol | KOH | 1 | 10 | 16 |
| F | 2-Methoxyethanol | KOH | 1 | 2.5 | <1 |
| F | 2-Ethoxyethanol | TMAH* | 1 | 1 | <1 |
| F | 2-Phenoxyethanol | KOH | 1 | 10 | 12.1 |
| F | Water | TBAH** | ~0.4(10%) | 3 | 9.2 |
| F | Water | $Na_2CO_3$ | 1 | 3 | 29.2 |
| F | Water | $Na_2CO_3$ | 1 | 10 | 21.1 |

*TMAH = tetramethylammonium hydroxide pentahydrate
**TBAH = tetrabutylammonium hydroxide

TABLE V-E

| Type of Treated Wafer | DEVELOPER Solvent | Base | Concentration Moles/Liter | Time (Min.) | Sensitivity $\mu C/cm^2$ |
|---|---|---|---|---|---|
| G | n-Octanol | KOH | 1 | 10 | 40 |
| G | 2-Butoxyethanol | KOH | 1 | 10 | 80 |
| H | Water | $NH_4OH$ | 1 | 0.5 | 40 |
| H | Water | LiOH | 1 | 3 | 50.5 |
| H | Water | $Na_2CO_3$ | 1 | 30 | 26.5 |

EXAMPLE 4

PMAH was prepared by heting a PtBMA bulk polymer with a weight-average molecular weight of 78,000 at 230° C. for 3.5 hours in a vacuum. During this time the material lost 54.8% of its weight. The product was then dissolved in N-methylpyrrolidone, and the solution was filtered. The soluble polymer was coated on a silicon wafer. Spincoating was carried out under a blanket of dry nitrogen to avoid the formation of hazy films. The wafers were baked at either 180° C. or 230° C., exposed with a beam of 125 KeV protons, and developed for 10 minutes with a 0.64N solution of KOH in 2-ethoxyethanol. The wafer baked at 230° had a sensitivity of $4 \times 10^{12}$ ions/cm² and had a smooth surface after development. The wafer heated at 180° had a sensitivity of $2 \times 10^{12}$ ions/cm² and had a blotchy appearance that suggested that the unexposed resist was less resistant to the developer. When such wafers were developed with a 0.89N KOH solution in propylene glycol monomethyl either, the sensitivity of the PMAH that had been baked at either 180° or 230° was $1.3 \times 10^{13}$ protons/cm².

Similar wafers that had been coated with PMAH and baked at only 70° C. in a vacuum were exposed with 125 KeV protons and developed with 0.64N KOH in 2-ethoxyethanol. In this case the developer removed both the exposed and the unexposed resist.

This example illustrates the preparation of PMAH from PtBMA in the bulk. This examples further illustrates the use of an alternative irradiation source, an ion beam, and demonstrates the value of heating at a high temperature even if this temperature is not required to convert PtBMA to PMAH.

Examples 5 and 6 are descriptions of experiments utilized to determine the usuable temperature ranges for converting poly(tert-butyl methacrylate), or PtBMA, to poly(methacrylic anhydride), or PMAH.

EXAMPLE 5

Silicon wafers were spin-coated with approximately a 1300 Å thick coating of PtBMA and heated for various periods of time in a vacuum oven that was preheated to the test temperature. After the bake treatment, the thickness of the coating was approximately 5000 Å thick, if the PtBMA was fully converted to PMAH. The resist coating was then exposed to an electron beam to write a pattern of 25 μm squares. The electron beam system was of the type known as AEBLE 150, which is sold by Perkin-Elmer Corp. Each of the squares in the pattern was exposed to a different predetermined dose of electrons. The resist image was then developed by dipping for 10 min. in a 0.64–0.66N solution of potassium hydroxide in 2-ethoxyethanol and then rinsing with water. The normalized thickness of the squares was then measured with a Nanospec microarea film thickness gauge. The sensitivity (Q) was determined from plots of the normalized thickness against the log of the electron dose, Q being the dose at which the exposed resist was all removed by the developer. The results are presented in Table VI.

TABLE VI

| Bake Temperature, °C. | Bake Time | Q, μC/cm² |
|---|---|---|
| 170 | 17 hr | * |
| 180 | 17 hr | * |
| 190 | 17 hr | * |
| 200 | 17 hr | 1.2*** |
| 210 | 17 hr | 3.3 |
| 210 | 4 hr | 2.4 |
| 220 | 4 hr | 4.0 |
| 230 | 17 hr | 3.5 |
| 230 | 4 hr | 4.0 |
| 230 | 2 hr | 4.8 |
| 230 | 1 hr | 1.5** |
| 230 | 30 min | * |
| 240 | 2 hr | 3.5 |
| 240 | 1 hr | 2.6 |
| 250 | 2 hr | 4.2 |
| 250 | 30 min | 6.7 |
| 260 | 1 hr | 4.2 |
| 260 | 30 min | 5.8 |
| 260 | 15 min | <2.5 |
| 260 | 5 min | * |
| 270 | 30 min | 3.5 |
| 280 | 30 min | 4.4 |
| 280 | 10 min | <2.5 |
| 280 | 2 min | * |

*The unexposed resist was all removed by the development process.
**The unexposed resist was severely thinned by the development process.

EXAMPLE 6

The top of a ⅜ inch thick aluminum plate was machined to form a recess only slightly larger than a 3-inch diameter silicon wafer. A thermocouple was inserted in a hole in the side of the aluminum plate at 0.020 inch below the surface, to measure the temperature near the center of the plate. The plate was then heated on a hot plate until the thermocouple recorded a constant temperature. A silicon wafer with temperature indicating paints on the surface was placed in the recess of the hot aluminum plate. The paints that were utilized melted at various specified temperatures. These properties enabled them to be utilized to determine the temperature on the surface of the wafers. Within 10 sec, the paint sample melting at 343° C. had melted, while the samples melting at 357° C. or higher failed to melt within 6 min. Another wafer with an approximately 13000 Å thick coating of PtBMA was then placed in the recess and heated for 20 sec. The wafer was then removed, and the sensitivity of the resist coating was determined as described in Example 5. The sensitivity was <2.5 μC/cm².

Similar experiments indicated that when the PtBMA coating was heated at a temperature slightly above 371° C., the resisting coating was destroyed.

With respect to Examples 5 and 6, the bake time must be adjusted to conform to the requirements of the temperature being used.

The foregoing examples are merely exemplary embodiments of the present invention. Those skilled in the art can recognize that various alternatives, adaptations and modifications can be made within the scope of the present invention. Accordingly, the present invention is not limited to the specific examples as illustrated herein, but is limited only by the following claims.

What is claimed is:

1. A process for forming an image with a positive resist, said process comprising the steps of:
    (a) forming on a substrate a positive resist layer of poly(methacrylic anhydride);
    (b) baking the resist at a temperature of 200° to 350° C.;
    (c) irradiating said resist layer with a predetermined pattern of ionizing radiation;
    (d) developing the irradiated area with a developer comprising a solution of a base selected from the group consisting of alkali metal hydroxides, ammonium hydroxides (including quarternary ammonium hydroxides), alkali metal alkoxides and alkali metal carbonates; and a hydroxylic solvent selected from the group consisting of branched or straight chain alcohols having a $C_1$–$C_{12}$ carbon content and water or mixtures thereof; and
    (e) rinsing the resist with the same solvent selected above, or with water.

2. The method of claim 1 wherein the formation of a positive resist layer of poly(methacrylic anhydride) further comprises:
    (a) coating the substrate with a solution of poly(tert-butyl methacrylate); and
    (b) heating the coated substrate to about 220° to 280° C. for 1 to 24 hours to sufficiently convert the resist film to poly(methacrylic anhydride).

3. The process of claim 1 wherein the base is potassium hydroxide and the hydroxylic solvent is 2-ethoxyethanol.

4. The process of claim 1 wherein the concentration of the base in the hydroxylic solvent is .5M to 1M.

5. The process of claim 1 wherein the base is sodium hydroxide and the hydroxylic solvent is cellosolve.

6. The process of claim 1 wherein the base is potassium hydroxide and the hydroxylic solvent is water.

7. The process of claim 1 wherein the base is sodium hydroxide and the hydroxylic solvent is water.

8. The process of claim 1 wherein the base is potassium carbonate and the hydroxylic solvent is water.

9. The process of claim 1 wherein the base is sodium carbonate and the hydroxylic solvent is water.

10. The process of claim 1 wherein the base is tetrabutylammonium hydroxide and the hydroxylic solvent is water.

* * * * *